United States Patent [19]

Min

[11] Patent Number: 5,155,702
[45] Date of Patent: Oct. 13, 1992

[54] SEMICONDUCTOR MEMORY DEVICE

[75] Inventor: Dong S. Min, Seoul, Rep. of Korea

[73] Assignee: Samsung Electronics Co., Ltd., Suweon, Rep. of Korea

[21] Appl. No.: 617,628

[22] Filed: Nov. 26, 1990

[51] Int. Cl.⁵ .............................................. G11C 13/00
[52] U.S. Cl. ........................... 365/189.01; 365/189.05
[58] Field of Search ...................... 365/189.01, 189.02, 365/189.04, 189.05, 207, 206, 174

[56] References Cited

U.S. PATENT DOCUMENTS 4,999,814  3/1991  Hashimoto ..................... 365/189.05

Primary Examiner—Terrell W. Fears
Attorney, Agent, or Firm—Ladas & Parry

[57] ABSTRACT

The substrate current generated during the operation of a bit line equalizer can be reduced by adapting PMOS transistors which have a smaller ionization coefficient in its carrier of a hole than NMOS transistors for maintaining a pair of bit lines at the same potential before a sense amplifier is operated. Thus, the substrate voltage can be stabilized by reducing the substrate current in the operation of the bit line equalizer.

2 Claims, 3 Drawing Sheets

SEMICONDUCTOR MEMORY DEVICE

BACKGROUND OF THE INVENTION

The present invention relates to a semiconductor memory device and more particularly to a memory device including a bit line equalizing circuit which can reduce the generation of substrate current and thus stabilize a substrate voltage.

As the semiconductor device has a tendency toward high integration, the number of sense amplifier and bit line equalizers also proportionally increases. The bit line equalizer makes potentials of a pair of bit lines BL and $\overline{BL}$ equal before that the potentials of the pair of bit lines BL and $\overline{BL}$ are amplified by the sense amplifier. Thus, when the voltages of the bit lines are amplified, data is detected by the potential change of the bit lines.

FIG. 1 is a circuit diagram of a conventional memory device. In FIG. 1, the conventional memory device comprises a bit line equalizer 10, a memory cell 20, and a sense amplifier 30. The bit line equalizer 10 is located between the bit lines BL and $\overline{BL}$, where a voltage $V_{BL}$ is applied to the sources of NMOS transistors N1 and N2 for charging the bit lines BL and $\overline{BL}$ which are connected to their drains, respectively. Also, an NMOS transistor N3 is connected to the bit lines BL and $\overline{BL}$ with its source and drain in order to equalizer their potential to the bit line precharge voltage $V_{BL}$ which is conventionally half of a power supply voltage, that is, ½Vcc. A bit line equalizing control clock φEQ is applied to gates of the NMOS transistors N1, N2 and N3. The memory cell 20 comprises two NMOS transistors N4 and N5, of which gates are connected to word lines WLn and WLn+1, sources are connected to capacitors C1 and C2 for storing cell data, and drains are connected to the bit lines BL and $\overline{BL}$, respectively. The bit lines BL and $\overline{BL}$ are also connected to the sense amplifier 30.

FIG. 2 is a diagram illustrating operational waveforms of the conventional memory device as shown in FIG. 1. The bit lines BL and $\overline{BL}$ are respectively amplified to a ground voltage Vss and the power supply voltage Vcc by the sense amplifier 30 when a RAS(row address strobe) signal as shown in FIG. 2(A) is in a low level state. Next, if the RAS signal goes into a high level of nonactivation state, the bit line equalizing control clock φEQ in a high level state as shown in FIG. 2(B) is applied to the gates of the NMOS transistors N1, N2 and N3 by a chip selector which is not shown in FIG. 1. Also, the word lines WLn and WLn+1 as shown in FIG. 2(C) become a low level state in a row address (not shown) before the bit line equalizing control clock φEQ becomes a high level state.

Then, the NMOS transistors N4 and N5 in the memory cell 20 is turned off and thus the data stored in capacitors C1 and C2 are not discharged toward the bit lines BL and $\overline{BL}$. Consequently, the bit lines BL and $\overline{BL}$ are equalized to the bit line precharge voltage $V_{BL}$ as shown in FIG. 2(D) and maintained on until next activation cycle.

At this time, the NMOS transistor N3 to equalize the bit lines BL and $\overline{BL}$ in the bit line equalizer 10 is turned on by the bit line equalizing control clock φEQ after the supply voltage Vcc was applied between the source and the drain of the NMOS transistor N3 in such a manner that the source and the drain of the NMOS transistor N3 have different potentials in the power supply voltage Vcc thereof and the bit line equalizing control clock φEQ applied to the gate of the NMOS transistor N3 is changed into the power supply voltage Vcc from the ground voltage Vss so as to generate the substrate current.

Also, according to the high integration tendency of the memory device, the numbers of memory cells, sense amplifiers, and bit line equalizers are also increased and the number of bit line equalizers which is operating for every activation cycle is also increased. Therefore, the amount of the substrate current which is produced during the operation of the bit line equalizers is increased and thus the substrate potential is largely changed, thereby weakening in the reliability of the memory device.

SUMMARY OF THE INVENTION

The present invention has an object to provide a semiconductor memory device which can stabilize the substrate voltage by reducing the substrate current which is generated during the operation of the bit line equalizer.

According to the present invention, there is provided a semiconductor memory device comprising a plurality of memory cells, sense amplifiers and bit line equalizers, each of the bit line equalizers including a PMOS transistor to serve as bit line equalizing means, of which source and drain are respectively connected with a pair of bit lines in such a manner that the source is connected with one bit line and drain is connected with the other bit line, and of which gate is provided with a bit line equalizing control clock.

BRIEF DESCRIPTION OF THE DRAWINGS

These and other objects, features, and advantages of the present invention will become more apparent from the following description for the preferred embodiments taken in conjunction with the accompanying drawings, in which:

FIGS. 2A-2D is a diagram illustrating operational waveforms the conventional semiconductor memory device as shown in FIG. 1;

FIGS. 4A-4E is a diagram illustrating operational waveforms of the semiconductor memory device according to the present invention as shown in FIG. 3;

FIGS. 6A-6D is a diagram illustrating operational waveforms of the semiconductor memory device as shown in FIG. 5.

DETAILED DESCRIPTION OF THE PREFERRED EMBODIMENT

The present invention will be now described in more detail with reference to the accompanying drawings.

Figure 1:
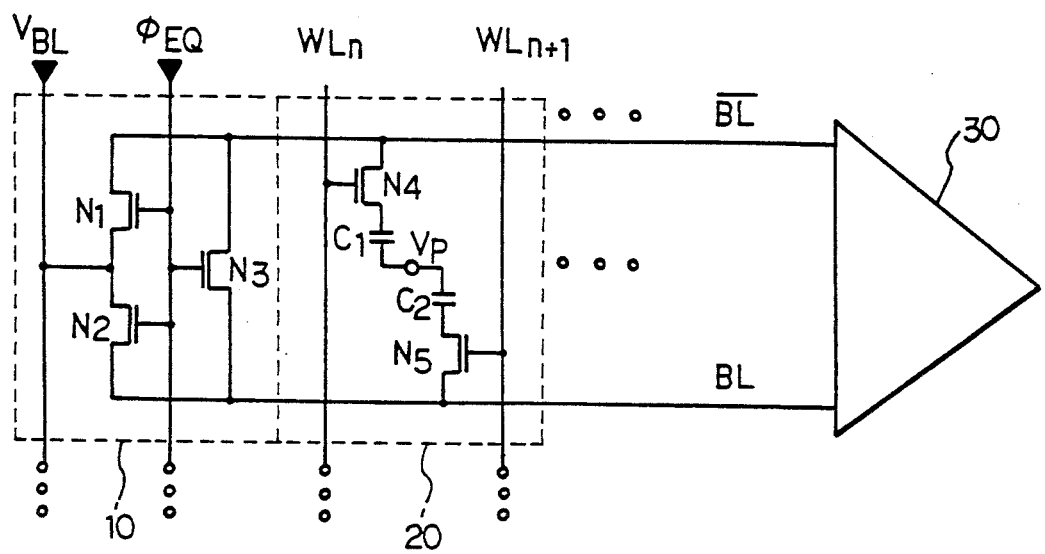
FIG. 1 is a schematic circuit diagram of a conventional semiconductor memory device.
Figure 2:
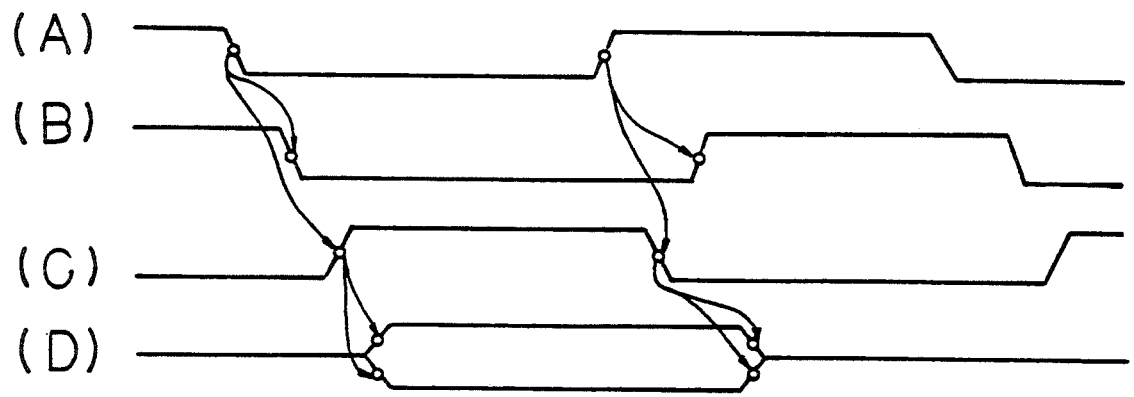
FIG. 2 including
Figure 3:
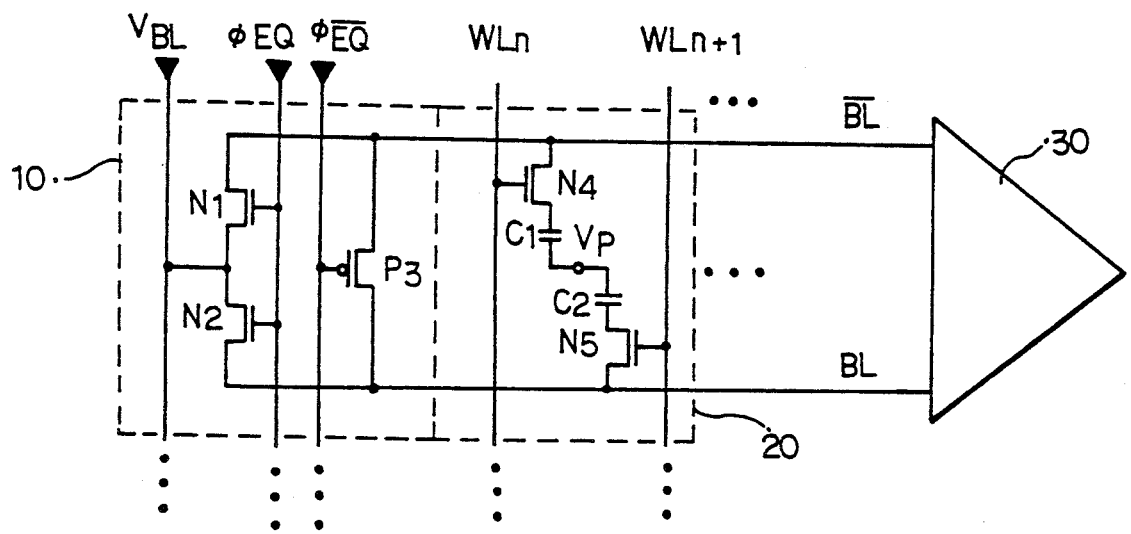
FIG. 3 is a schematic circuit diagram of a semiconductor memory device according to the present invention.

FIG. 3 shows a preferred embodiment of a semiconductor memory device according to the present invention. The semiconductor memory device comprises an equalizer 10, a memory cell part 20 and a sense amplifiers 30. The bit line equalizer 10 is located between a pair of bit lines BL and $\overline{BL}$ and includes two NMOS transistors N1 and N2 for precharging the bit lines BL and $\overline{BL}$ into a bit line precharge voltage $V_{BL}$ and a PMOS transistor P3 for equalizing the voltages of the bit lines BL and $\overline{BL}$.

The bit line precharge voltage $V_{BL}$ is applied to sources of the NMOS transistors N1 and N2, while their drains are connected to the bit lines BL and $\overline{BL}$. Furthermore, gates of the NMOS transistors N1 and N2 are applied with a bit line equalizing control clock $\phi EQ$ which is generated from a chip selector (not shown in FIG. 3). On the other hand, the PMOS transistor P3 are connected to the bit lines BL and $\overline{BL}$ with its source and drain respectively and another bit line equalizing control clock $\overline{\phi EQ}$ is applied to its gate.

The memory cell part 20 includes two NMOS transistors N4 and N5 of which sources are connected to capacitors C1 and C2 for storing cell data, drains are connected to the bit lines BL and $\overline{BL}$, and gates are connected to word lines WLn and WLn+1, respectively. The bit lines BL and $\overline{BL}$ are also connected to the sense amplifier 30.

Figure 4:
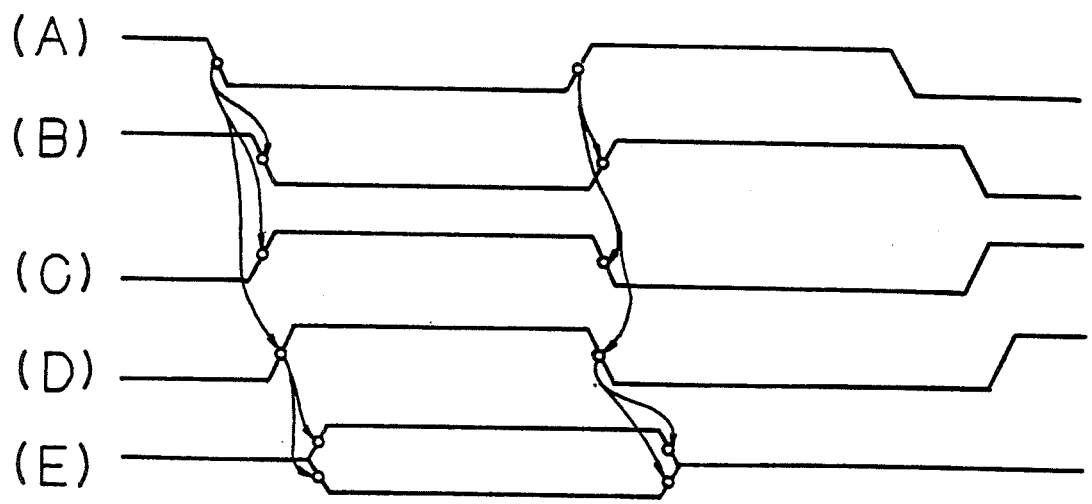
FIG. 4 including

FIG. 4(A)~(E) show the operational waveform of the semiconductor memory device as shown in FIG. 3. In operation, when a RAS signal as shown in FIG. 4(A) is in a low level state, each low and high level bit line equalizing control clocks $\phi EQ$ and $\overline{\phi EQ}$ as shown in FIG. 4(B) and FIG. 4(C) is applied to each gate of the NMOS transistors N1 and N2 and the PMOS transistor P3, respectively. Thus, the NMOS transistors N1 and N2 and the PMOS transistor P3 are turned off, thereby preventing the bit lines BL and $\overline{BL}$ from charging and equalizing toward the precharge voltage $V_{BL}$.

In that case, either of the word lines WLn and WLn+1 becomes a high level state which is synchronous with the RAS signal, thereby turning on either of the NMOS transistors N4 and N5 in the memory cell part 20. That is, the NMOS transistor N4 is turned on for the high level state of the word line WLn. Thus, the potential of the bit line $\overline{BL}$ reached to a supply voltage Vcc by the data stored in the capacitor C1 while the potential of the other bit line BL is the ground voltage Vss.

FIG. 4(E) shows the state of the bit lines BL and BL to be amplified by the sense amplifier 30. Next, the RAS signal becomes a high level state of the noactivation cycle as shown in FIG. 4(A) and the chip selector provides each of the high and low level bit line equalizing control clocks $\phi EQ$ and $\overline{\phi EQ}$ according to the RAS signal, as shown in FIG. 4(B) and FIG. 4(C).

In that case, the word lines WLn and WLn+1 becomes a low level state quickly than the bit line equalizing control clocks $\phi EQ$ and $\overline{\phi EQ}$ which are synchronous with the RAS signal as shown in FIG. 4(D), so that the NMOS transistors N4 and N5 in the memory cell part 20 are turned off. Subsequently, the NMOS and PMOS transistors N1, N2 and P3 in the bit line equalizer 10 are turned on according to the bit line equalizing control clocks $\phi EQ$ and $\overline{\phi EQ}$ so that the bit lines BL and BL are precharged and equalized to the bit line precharge voltage $V_{BL}$, as shown in FIG. 4(E).

In general, the ionization coefficient of an electron is about ten times larger than that of a hole, so that the substrate current of a PMOS transistor can be reduced to a tenth of that of NMOS transistor by adapting a hole as a carrier. Thus, the substrate current can be considerably reduced since the bit lines BL and $\overline{BL}$ are equalized to the bit line precharge voltage $V_{BL}$ by the PMOS transistor P3.

Figure 5:
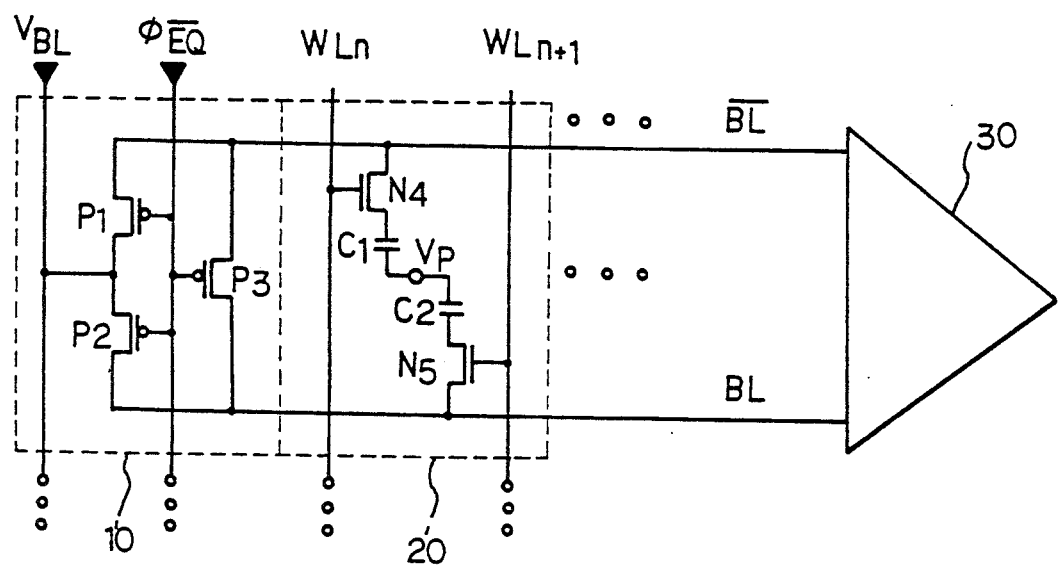
FIG. 5 is a schematic circuit diagram of another semiconductor memory device according to the present invention.
Figure 6:
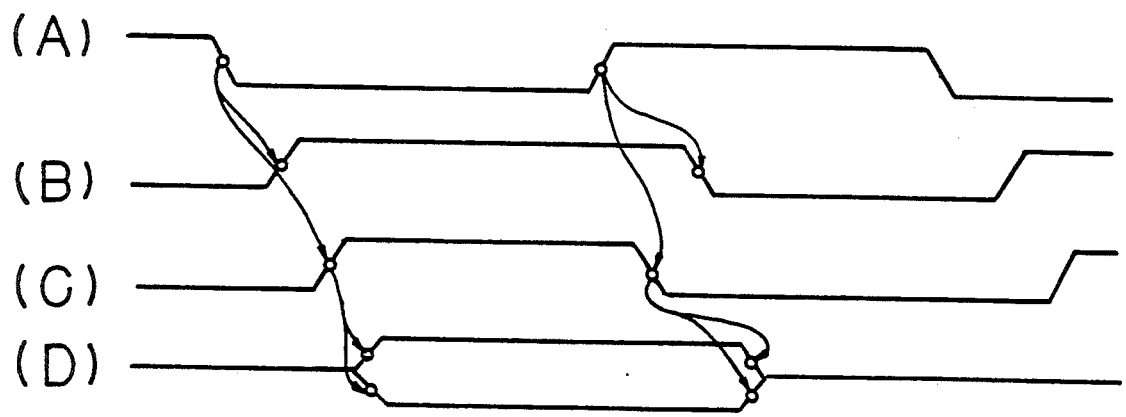
FIG. 6 including

FIG. 5 shows another preferred embodiment of the semiconductor memory device according to the present invention. In FIG. 5, the semiconductor memory device comprises a bit line equalizer 10, a memory cell 20, and a sense amplifier 30 similarly to that in FIG. 3. But, the bit line equalizer 10 includes two PMOS transistors P1 and P2 for precharging the bit lines BL and $\overline{BL}$ into the precharge voltage $V_{BL}$ and an equalizing transistor P3 for equalizing the precharged bit lines BL and $\overline{BL}$ which are turned on according to a bit line equalizing control clock $\overline{\phi EQ}$. FIG. 6(A)~FIG. 6(D) show operational waveforms of the semiconductor memory device as shown in FIG. 5.

As mentioned up to now, according to the present invention, the substrate current generated in the operation of the bit line equalizer can be reduced by adapting PMOS transistors which have a smaller ionization coefficient in is carrier of a hole than NMOS transistors for maintaining the bit lines at the same potential before the operation of the sense amplifier. Furthermore, according to the present invention, the substrate voltage can be stabilized by reducing the substrate current in the operation of the bit line equalizer.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A semiconductor memory device comprising a plurality of memory cells, sense amplifiers and bit line equalizers, each of said bit line equalizers including a PMOS transistor to serve as a bit line equalizing means, each said PMOS transistor having a source, a drain and a gate, wherein said source and said drain and respectively connected with a pair of bit lines in such a manner that the source is connected with one bit line and the drain is connected with the other bit line, and said gate is provided with a bit line equalizing control clock.

2. A semiconductor memory device according to claim 1, wherein each of said bit line equalizers includes PMOS transistors to serve as a bit line precharging means for maintaining said bit lines at a bit line precharge voltage $V_{BL}$.

* * * * *